(12) United States Patent
Liu et al.

(10) Patent No.: US 10,319,563 B2
(45) Date of Patent: Jun. 11, 2019

(54) ELECTRONIC BEAM MACHINING SYSTEM

(71) Applicants: Tsinghua University, Beijing (CN); HON HAI PRECISION INDUSTRY CO., LTD., New Taipei (TW)

(72) Inventors: Peng Liu, Beijing (CN); Wei Zhao, Beijing (CN); Xiao-Yang Lin, Beijing (CN); Duan-Liang Zhou, Beijing (CN); Chun-Hai Zhang, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/220,340

(22) Filed: Dec. 14, 2018

(65) Prior Publication Data

US 2019/0139738 A1    May 9, 2019

Related U.S. Application Data

(63) Continuation of application No. 15/615,324, filed on Jun. 6, 2017.

(30) Foreign Application Priority Data

Jun. 8, 2016    (CN) .......................... 2016 1 0405200

(51) Int. Cl.
*H01J 37/00*     (2006.01)
*H01J 37/30*     (2006.01)
*C01B 32/182*    (2017.01)
*C01G 39/06*     (2006.01)
*H01J 37/302*    (2006.01)
(Continued)

(52) U.S. Cl.
CPC ........ *H01J 37/3002* (2013.01); *C01B 32/182* (2017.08); *C01G 39/06* (2013.01); *H01J 37/302* (2013.01); *B82Y 20/00* (2013.01); *B82Y 35/00* (2013.01); *C01P 2004/24* (2013.01); *H01J 37/3056* (2013.01); *H01J 37/31* (2013.01); *H01J 37/315* (2013.01); *H01J 37/3174* (2013.01); *Y10S 977/734* (2013.01); *Y10S 977/755* (2013.01); *Y10S 977/932* (2013.01)

(58) Field of Classification Search
CPC .. H01J 37/3002; H01J 37/3056; H01J 37/315; H01J 37/302; H01J 37/31; H01J 37/3174; C01B 32/182; C01G 39/06; Y10S 977/932; Y10S 977/734; Y10S 977/755; B82Y 20/00; C01P 2004/24
USPC .................. 250/396 R, 398, 492.1–492.3
See application file for complete search history.

(56) References Cited

U.S. PATENT DOCUMENTS 5,767,521 A  *  6/1998  Takeno ................. B82Y 10/00
                                                    250/492.2

* cited by examiner

*Primary Examiner* — Michael Maskell
(74) *Attorney, Agent, or Firm* — ScienBiziP, P.C.

(57) ABSTRACT

The disclosure relates to an electronic beam machining system. The system includes a vacuum chamber; an electron gun located in the vacuum chamber and used to emit electron beam; a holder located in the vacuum chamber and used to fix an object; a control computer; and a diffraction unit located in the vacuum chamber; the diffraction unit includes a two-dimensional nanomaterial; the electron beam transmits the two-dimensional nanomaterial to form a transmission electron beam and a plurality of diffraction electron beams; the transmission electron beam and the plurality of diffraction electron beams radiate the object to form a transmission spot and a plurality of diffraction spots.

18 Claims, 12 Drawing Sheets

(51) Int. Cl.
*H01J 37/31* (2006.01)
*H01J 37/315* (2006.01)
*H01J 37/317* (2006.01)
*B82Y 20/00* (2011.01)
*H01J 37/305* (2006.01)
*B82Y 35/00* (2011.01)

(a) 2D material     (b) 3D material

ELECTRONIC BEAM MACHINING SYSTEM

BACKGROUND

1. Technical Field

The present disclosure relates to an electronic beam machining (EBM) system and a photolithography method based on electronic beam.

2. Description of Related Art

Electronic beam machining (EBM) is a method to treat a workpiece by heat generated by the electron beam having high power density. The electronic beam machining can be used to for surface heat treatment, welding, etching, drilling, melting, or material sublimation.

The electrons emitted from the scorching cathode filament in a vacuum are accelerated at high voltage in a range from about 30 KV to about 200 KV and focused by the electromagnetic lens to form the electron beam having a power density in a range from about 105 W/cm² to about 109 W/cm². The electron beam generates the heat at high temperature so that the workpiece is melted or sublimated. Thus, the welding, etching, or drilling can be performed on the workpiece. However, the conventional electronic beam machining system usually has one electron gun and can emit a single electron beam. Thus, the conventional electronic beam machining system has lower efficiency. If multiple electron guns are used, the electronic beam machining system would be complicated and have a high cost.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
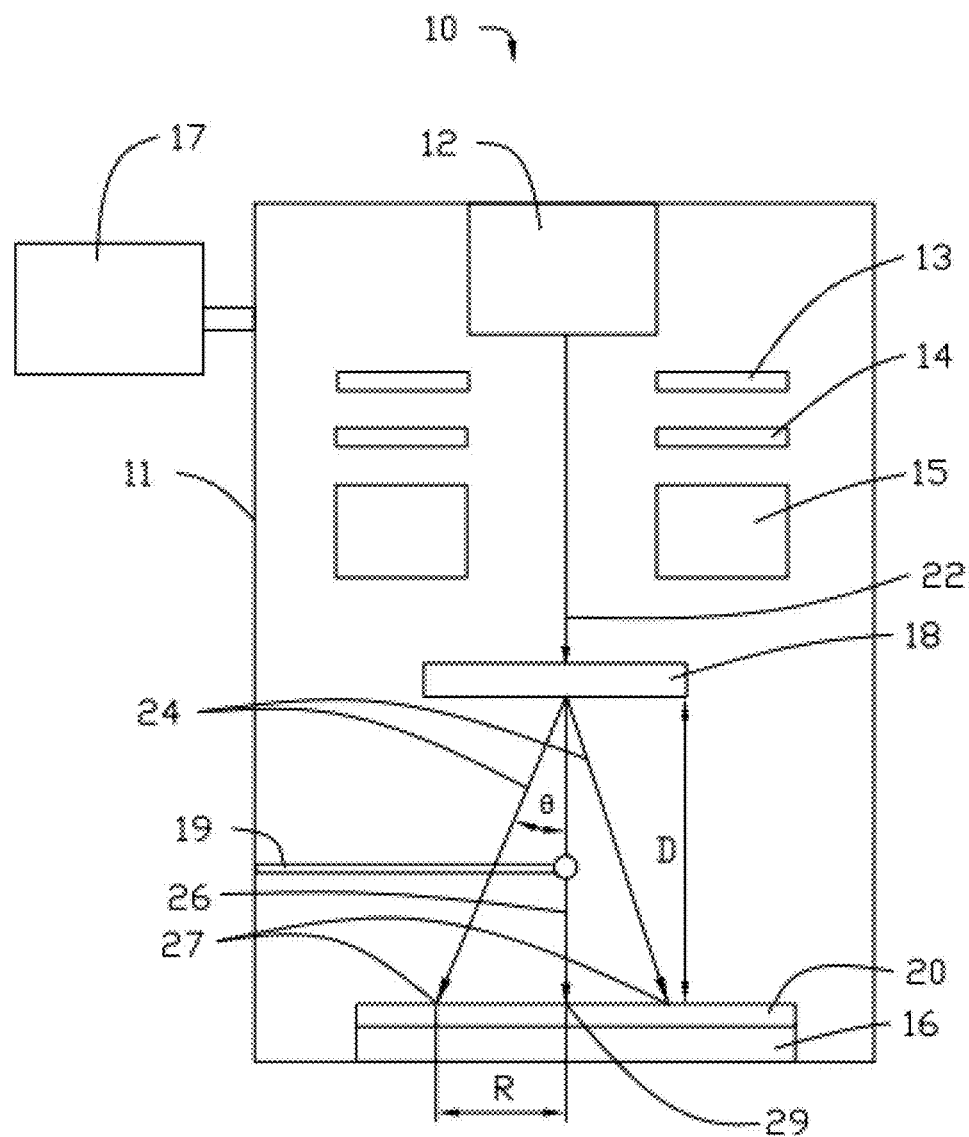
FIG. 1 is a schematic section view of one embodiment of an electronic beam machining system.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated better illustrate details and features. The description is not to considered as limiting the scope of the embodiments described herein.

Several definitions that apply throughout this disclosure will now be presented. The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one. In general, the word "module," as used herein, refers to logic embodied in hardware or firmware, or to a collection of software instructions, written in a programming language, such as, for example, Java, C, or assembly. One or more software instructions in the modules may be embedded in firmware, such as an EPROM. It will be appreciated that modules may comprise connected logic units, such as gates and flip-flops, and may comprise programmable units, such as programmable gate arrays or processors. The modules described herein may be implemented as either software and/or hardware modules and may be stored in any type of computer-readable medium or other computer storage device.

References will now be made to the drawings to describe, in detail, various embodiments of the present electronic beam machining system, and a photolithography method using the electronic beam machining system. The electronic beam machining system can be an electron beam lithography system, electron beam welding system, electron beam drilling system, electron beam melting system or electron beam heating system.

Referring to FIG. 1, an electronic beam machining system 10 of one embodiment is provided. The electronic beam machining system 10 is an electron beam lithography system and comprises a vacuum chamber 11, an electron emitter 12, a controlling gate 13, an accelerating electrode 14, a focus electrode 15, a holder 16, a control computer 17, and a diffraction unit 18.

Figure 2:
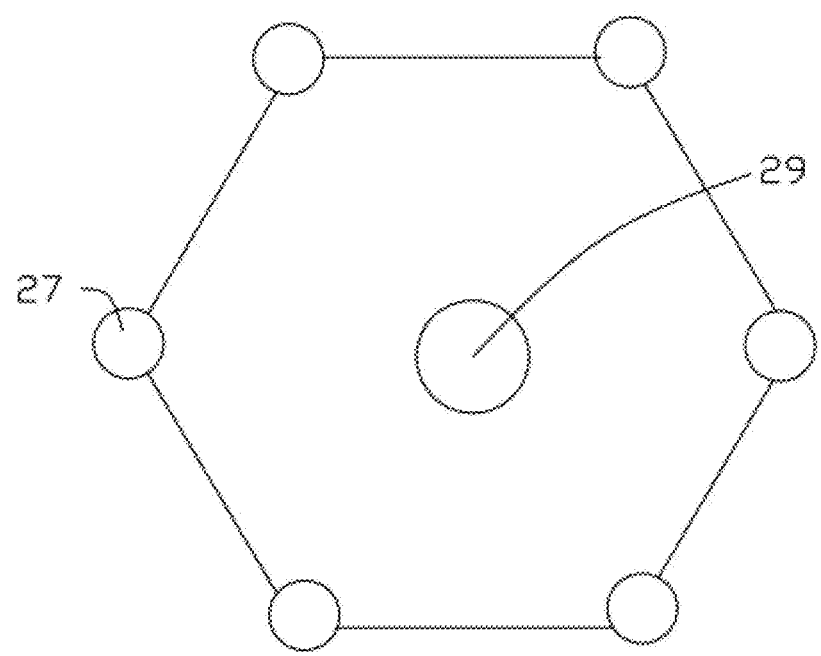
FIG. 2 is a schematic section view of a transmission spot and a plurality of diffraction spots.

The electron emitter 12, the controlling gate 13, the accelerating electrode 14, the focus electrode 15, the holder 16, and the diffraction unit 18 are located inside of the vacuum chamber 11. The electron emitter 12 is used to emit an electron beam. The electron beam can be accelerated by the accelerating electrode 14 and focused by the focus electrode 15 to form an incident electron beam 22 to radiate the diffraction unit 18. The diffraction unit 18 includes a two-dimensional nanomaterial. The incident electron beam 22 transmits the two-dimensional nanomaterial to form a transmission electron beam 26, and a plurality of diffraction electron beams 24. The transmission electron beam 26 and the plurality of diffraction electron beams 24 radiate and etch the object 20 fixed on the holder 16 to form a transmission spot 29 and a plurality of diffraction spots 27 as shown in FIG. 2. The holder 16 is configured to fix the object 20 and can be designed according to need. In one embodiment, the holder 16 is a stage. The plurality of diffraction spots 27 is arranged to form a diffraction ring. The control computer 17 is used to control the electronic beam machining system 10.

The vacuum chamber 11 is connected to a pumping device (not shown). In of one embodiment, the pumping device includes an ion pump, a first molecular pump, a second molecular pump, a mechanical pump, and a control unit. The ion pump and the second molecular pump are respectively connected to the vacuum chamber 11. The first molecular pump is connected to the vacuum chamber 11 via a pre-vacuum chamber. The mechanical pump is respectively connected to the first molecular pump and the second molecular pump. The control unit is configured to control the work of the vacuum pumping device. The pressure of the vacuum chamber 11 can be kept at a range from about $10^{-3}$ Pa to about $10^{-8}$ Pa.

The electron emitter 12 and the holder 16 are spaced from each other and located on two opposite ends of the vacuum chamber 11. The controlling gate 13, the accelerating electrode 14, the focus electrode 15, and the diffraction unit 18 are located between the electron emitter 12 and the holder 16. The electron emitter 12 can include a hot cathode electron source or a field emission cold cathode electron source.

The electron emitter 12, the controlling gate 13, the accelerating electrode 14, and the focus electrode 15 form an electron gun. The electron beam 22 provided by the electron gun can have energy in a range from about 0.2 KeV to about 200 KeV, a current in a range from about 0.01 microamperes to about 10 milliamperes, and a spot diameter in a range from about 1 micrometer to about 6 millimeters. In the electron beam lithography system, the incident electron beam 22 provided by the electron gun can have a lower energy and a spot diameter in a range from about 1 nanometer to about 100 micrometers. In the electron beam welding system, the electron beam drilling system, the electron beam melting system, or the electron beam heating system, the incident electron beam 22 provided by the electron gun can have a higher energy and a larger spot diameter. The electron gun can also be a laminar gun. The laminar gun can have a more uniform spot and greater current density.

In one embodiment, the electronic beam machining system 10 can include a moving platform (not shown) configured to move the electron gun to scan the object 20. In one embodiment, the electronic beam machining system 10 can include a deflection electrode (not shown) configured to move the incident electron beam 22 to scan the object 20.

In one embodiment, the diffraction unit 18 can also be connected to a power supply, supplied with an electric potential, and used to accelerate the incident electron beam 22. Thus, the accelerating electrode 14 is optional. In one embodiment, diffraction unit 18 is connected to an external circuit to conduct away the electrons absorbed by the two-dimensional nanomaterial of the diffraction unit 18.

Figure 3:
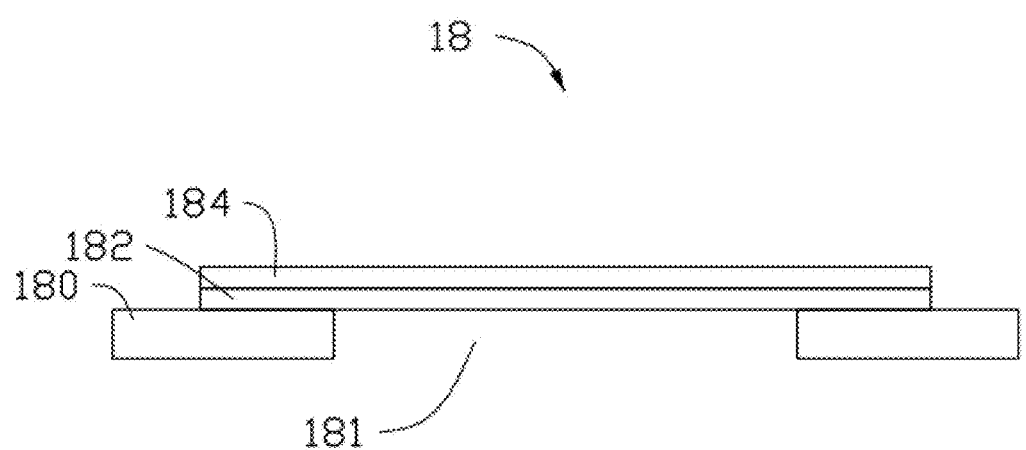
FIG. 3 is a schematic section view of one embodiment of a diffraction unit.
Figure 12:
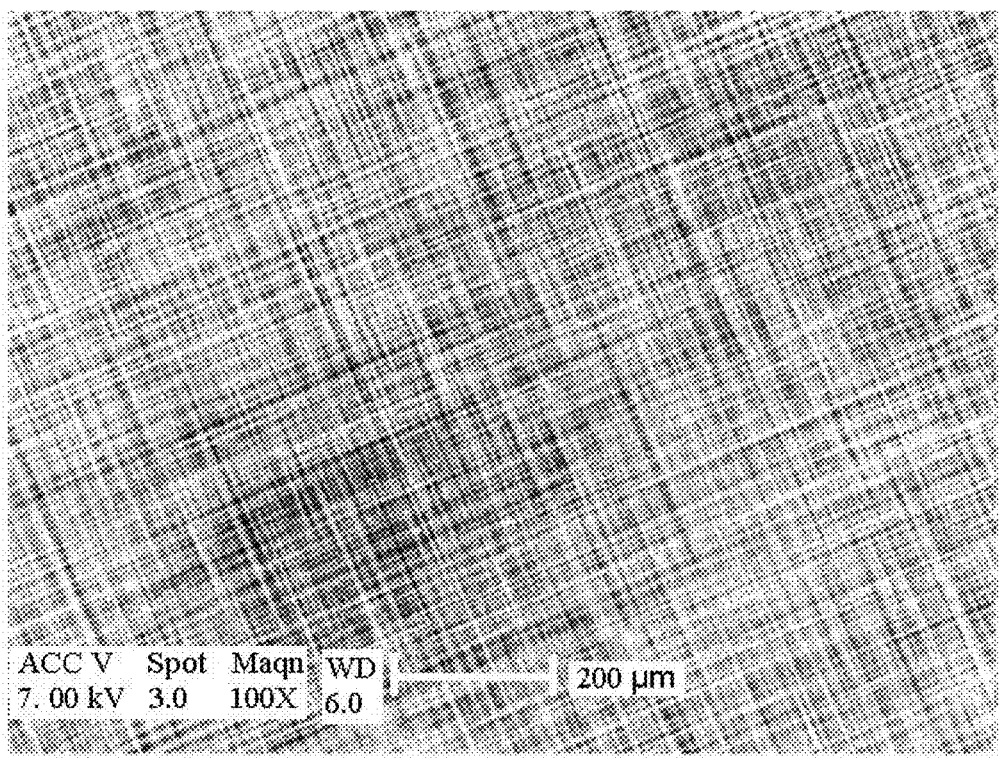
FIG. 12 is a Scanning Electron Microscope (SEM) image of two cross-stacked drawn carbon nanotube films.

Referring to FIG. 3, the diffraction unit 18 includes a supporter 180, a grid 182, and a two-dimensional nanomaterial 184. The supporter 180 is configured to support and fix the grid 182 and the two-dimensional nanomaterial 184. The shape and the size of the supporter 180 are not limited and can be designed according to need. In one embodiment, the supporter 180 is a metal sheet, such as a copper plate, having a central through hole 181. The size of the central through hole 181 is smaller than the grid 182. The grid 182 is located on the supporter 180 and covers the central through hole 181. The shape and the size of the grid 182 are not limited and can be designed according to need. The grid 182 can be a copper mesh or a carbon nanotube structure. In one embodiment, as shown in FIG. 12, the grid 182 includes two drawn carbon nanotube films stacked with each other. The drawn carbon nanotube film includes a plurality of carbon nanotubes orderly arranged and spaced from each other. The aligned directions of the carbon nanotubes between adjacent stacked drawn carbon nanotube films is about 90 degrees. Thus, parts of the two-dimensional nanomaterial 184 are suspended on a hole between adjacent carbon nanotubes. The drawn carbon nanotube film is an ultra thin, sparse porous structure and has little effect on the two-dimensional nanomaterial 184. Furthermore, because the primary diffraction spot of the drawn carbon nanotube film is formed by the diffraction that occurs between the adjacent wall of the carbon nanotubes, and has a low angle, the drawn carbon nanotube film would not influence the diffraction spots of the two-dimensional nanomaterial 184. The two-dimensional nanomaterial 184 can cover the grid 182. The two-dimensional nanomaterial 184 can be graphene sheet or $MoS_2$ sheet. Furthermore, the electronic beam machining system 10 can include a moving device to move the diffraction unit 18 along XYZ directions. Thus, the distance D between the two-dimensional nanomaterial 184 and the object 20 is adjustable.

Furthermore, the electronic beam machining system 10 can include a conductor shield 19 and used to shield the transmission spot 29 and/or at least one of the plurality of diffraction spots 27 and allow the rest of the transmission spot 29 and the plurality of diffraction spots 27 to pass through. The shape and the size of the conductor shield 19 can be designed according to need. The conductor shield 19 can be a conductive rod or conductive plate. In one embodiment, the conductor shield 19 is a conductive rod having a first end and a second end opposite to the first end. The first end of the conductive rod is fixed on the inner wall of the vacuum chamber 11. The conductive rod is rotatable and can be rotated to be between the two-dimensional nanomaterial 184 and the object 20. The conductor shield 19 is connected to an external circuit to conduct away the electrons absorbed by the conductor shield 19. In one embodiment, both the conductor shield 19 and the two-dimensional nanomaterial of the diffraction unit 18 are connected to the same external circuit. The electronic beam machining system 10 can also include a Faraday cup (not shown) so that only a single diffraction beam can be obtained to radiate the object 20.

Figure 4:
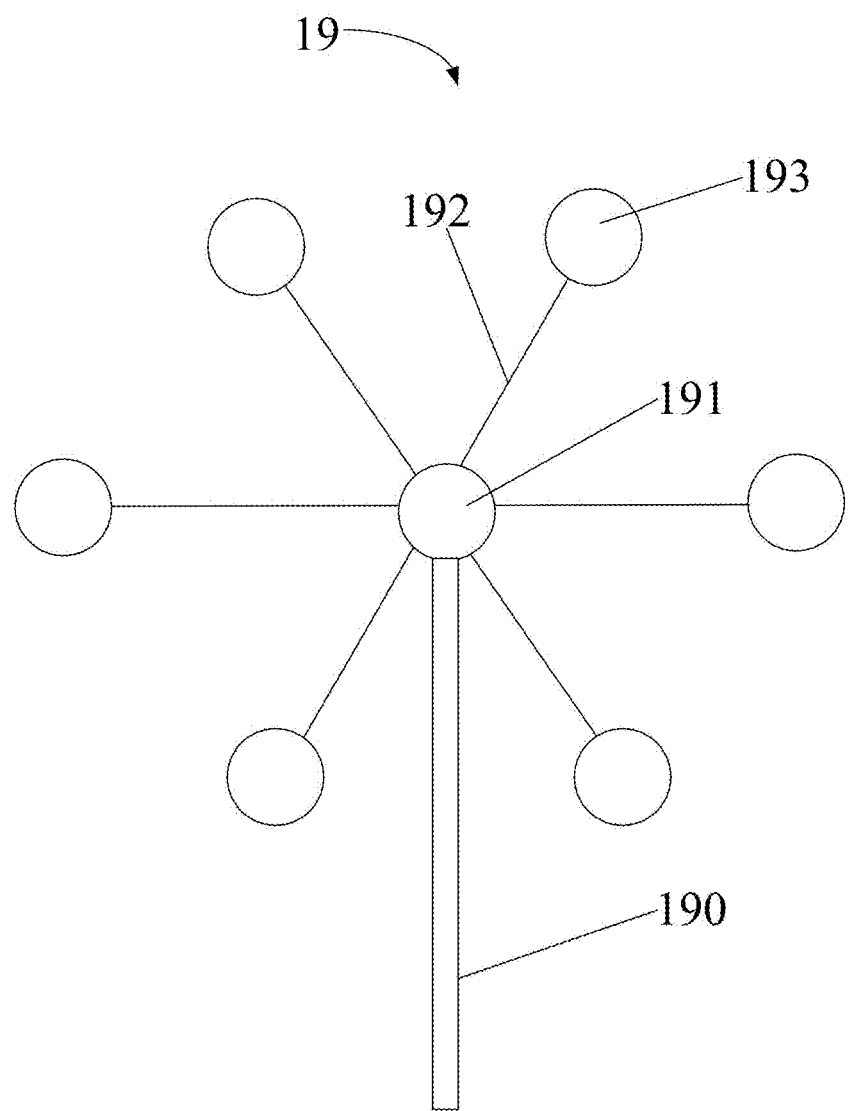
FIG. 4 is a schematic section view of one embodiment of a conductor shield.

Referring to FIG. 4, in one embodiment, the conductor shield 19 includes a first conductive rod 190 having a first end fixed on the inner wall of the vacuum chamber 11 and a second end opposite to the first end; a first conductive plate 191 fixed on the second end; six second conductive rods 192 connected to the first conductive plate 191; and six second conductive plates 193 respectively connected to the six second conductive rods 192. The first conductive plate 191 is configured to shield the transmission spot 29. The second conductive plates 193 are configured to shield the plurality of diffraction spots 27. The second conductive rods 192 are rotatable around the first conductive plate 191 so that any two of the second conductive plates 193 can be overlapped with each other. The number of the second conductive rods 192 and the second conductive plates 193 are the same and can be selected according to the pattern of the diffraction ring of the plurality of diffraction spots 27.

The control computer 17 includes a calculating module and a distance controlling module. The calculating module is configured to calculate the distance D between the two-dimensional nanomaterial 184 and the object 20 according to the lattice period d of the two-dimensional nanomaterial 184 and the radius R of diffraction ring. The distance controlling module is configured to adjust the distance D between the two-dimensional nanomaterial 184 and the object 20.

The two-dimensional nanomaterial, especially, two-dimensional nanomaterial only having a single layer of atoms with different electron diffraction principles. The difference between the conventional electron diffraction of three-dimensional nanomaterial and the electron diffraction of two-dimensional nanomaterial is described below.

Figure 5:
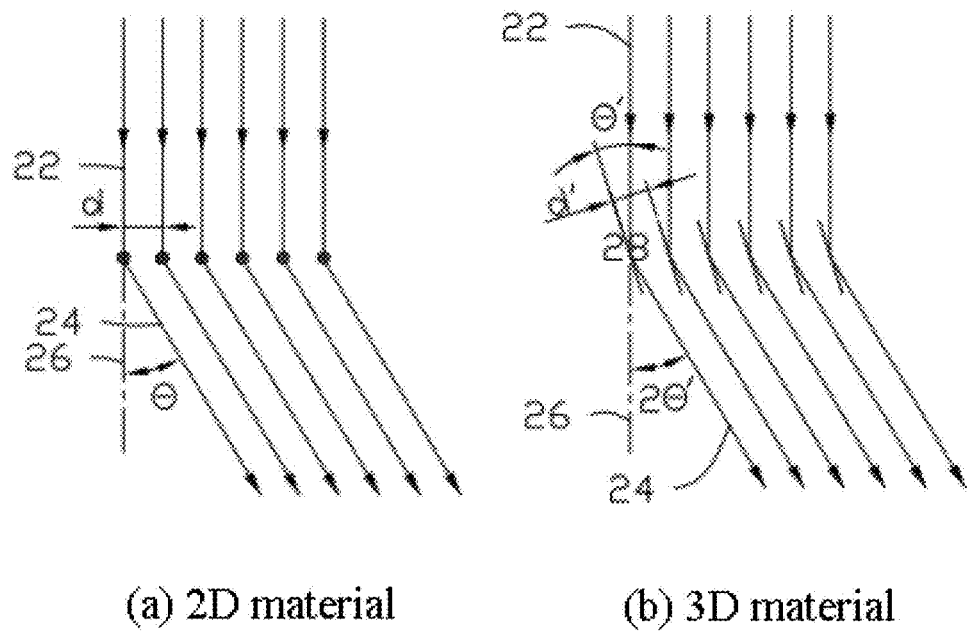
FIG. 5 is a schematic diagram of electron diffraction of one embodiment when an electron beam passes through two-dimensional (2D) nanomaterial or three-dimensional (3D) nanomaterial.

Referring to FIG. 5 (a), the electron diffraction of the two-dimensional nanomaterial satisfies the condition $d \sin \theta = \lambda$, wherein d represents the lattice period of the two-dimensional nanomaterial, $\theta$ represents the angle between the diffraction electron beam 24 and the transmission electron beam 26. Referring to FIG. 5 (b), the electron diffraction of the three-dimensional nanomaterial satisfies the condition $2d' \sin \theta' = \lambda$, wherein d' represents the interplanar spacing of the three-dimensional nanomaterial, $\theta'$ represents the angle between the incident electron beam 22 and the crystal surface 28 of the three-dimensional nanomaterial. In the conventional electron diffraction of three-dimensional nanomaterial, the angle between the diffraction electron beam 24 and the transmission electron beam 26 is $2\theta'$. Usually, in selected area electron diffraction, the $\theta$ or $\theta'$ is much small and satisfies the condition $\theta \cong \sin \theta \cong \tan \theta$ or $\theta' \cong \sin \theta' \tan \theta'$. Thus, in the electron diffraction of the two-dimensional nanomaterial, it satisfies the condition $d \sin \theta \cong d \theta = \lambda$, however, in the conventional electron diffraction of three-dimensional nanomaterial, it satisfies the condition $2d' \sin \theta' \cong 2d' \theta' = d' 2\theta' = \lambda$.

The lattice period d of the two-dimensional nanomaterial 184 and the wavelength $\lambda$ of the incident electron beam 22 can be stored in or obtained by the control computer 17. The radius R of diffraction ring can be obtained according to the desired etching pattern. Referring to FIG. 2, along the same crystal direction, the diffraction electron beam 24 form a plurality of diffraction spots 27 on the object 20, and the transmission electron beam 26 form a transmission spot 29 on the object 20. The distance between the diffraction spot 27 and the transmission spot 29 is equal to the radius R of diffraction ring. Thus, the distance D between the two-dimensional nanomaterial 184 and the object 20 can be calculated according to the formulas $d \sin \theta \cong d \theta = \lambda$ and $\sin \theta = R/(D^2 + R^2)^{1/2}$.

Figure 6:
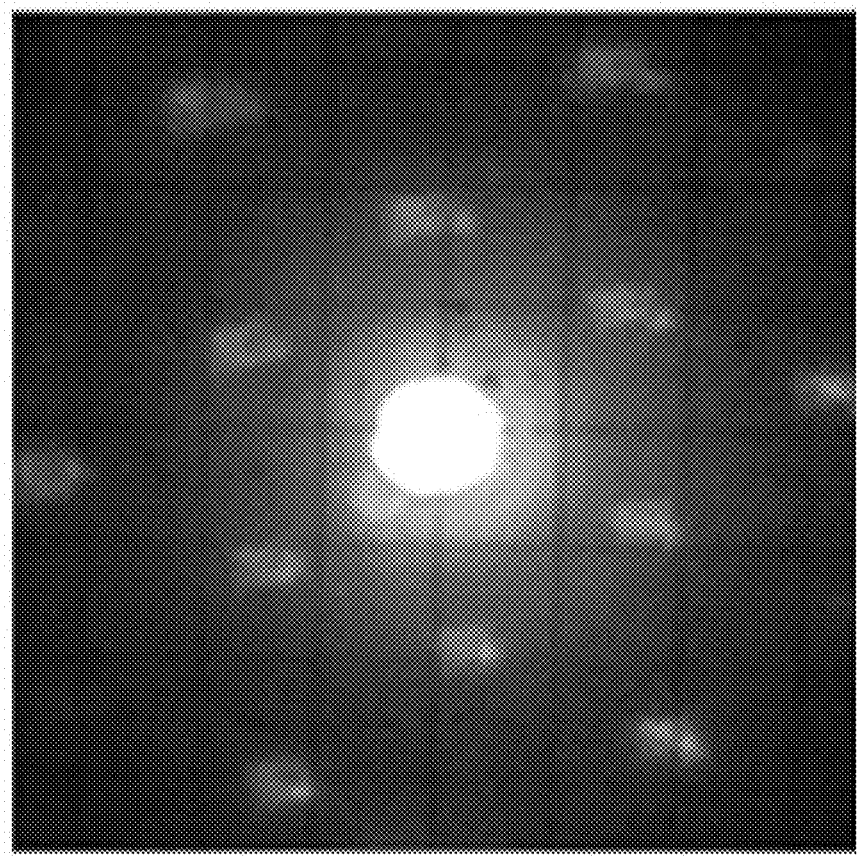
FIG. 6 shows a transmission and diffraction image of one embodiment of a single-layered single crystal graphene sheet.
Figure 7:
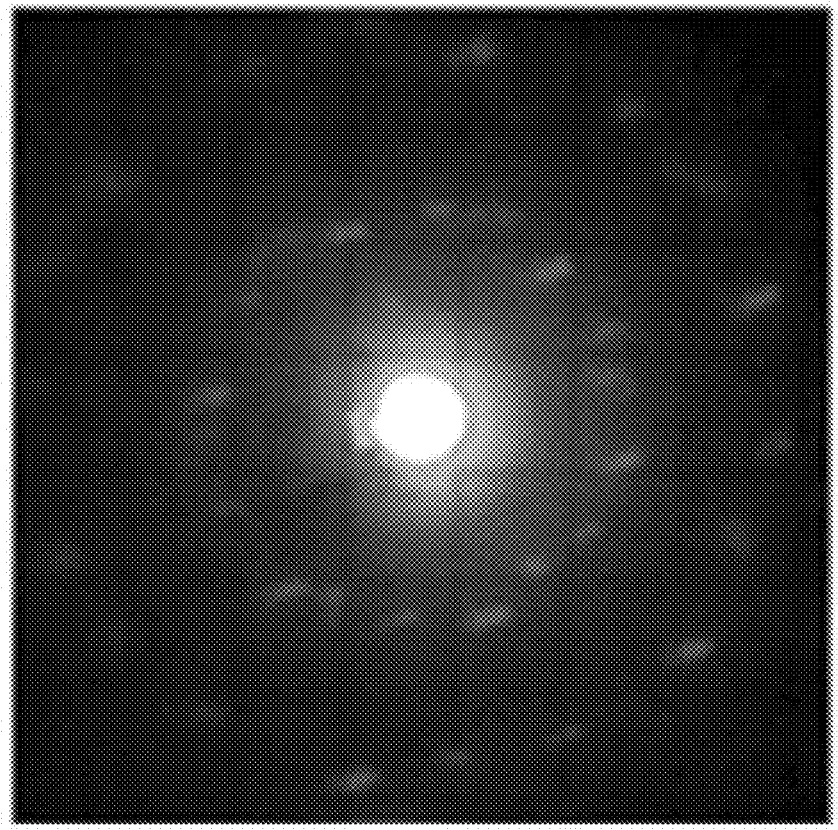
FIG. 7 shows a transmission and diffraction image of one embodiment of a three-layered single crystal graphene sheets.
Figure 8:
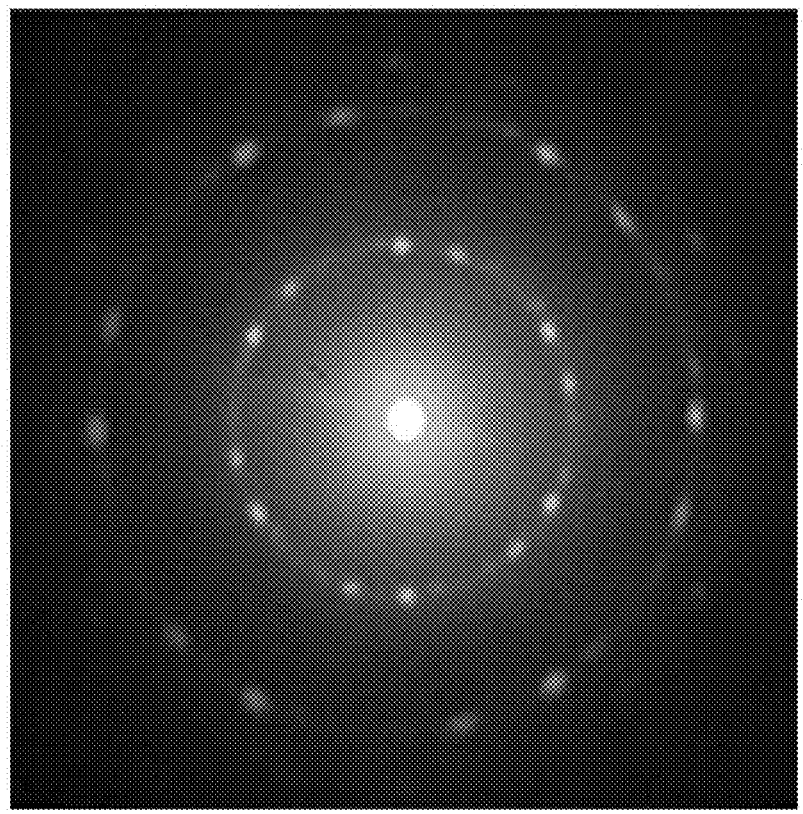
FIG. 8 shows a transmission and diffraction image of one embodiment of a large area polycrystalline graphene sheet.
Figure 9:
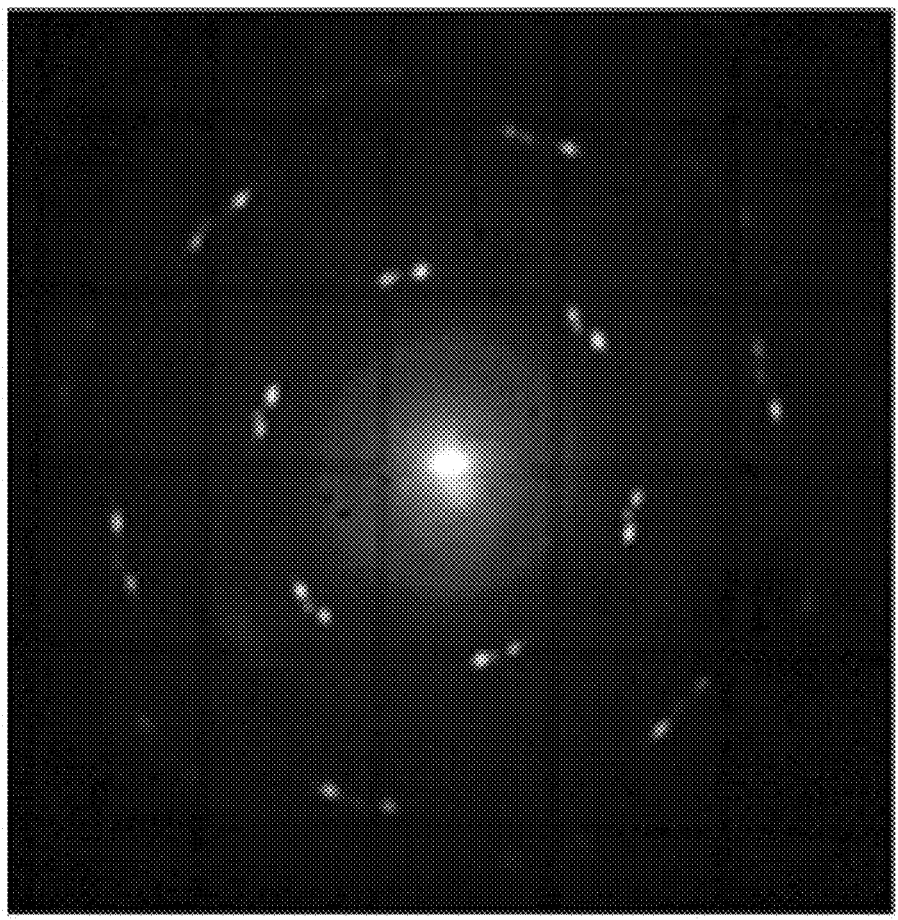
FIG. 9 shows a transmission and diffraction image of one embodiment of a single-layered single crystal $MoS_2$ sheet.

The number of the diffraction electron beams 24 and the pattern of the diffraction ring formed by the diffraction electron beams 24 can be adjusted by selecting the two-dimensional nanomaterial 184. FIG. 6 shows a transmission and diffraction image when the incident electron beam 22 entirely cover and passes through a single-layered single crystal graphene sheet. FIG. 7 shows a transmission and diffraction image when the incident electron beam 22 entirely cover and passes through a three-layered single crystal graphene sheets. FIG. 8 shows a transmission and diffraction image when the incident electron beam 22 entirely cover and passes through a large area polycrystalline graphene sheet. FIG. 9 shows a transmission and diffraction image when the incident electron beam 22 entirely cover and passes through a single-layered single crystal $MoS_2$ sheet.

Figure 10:
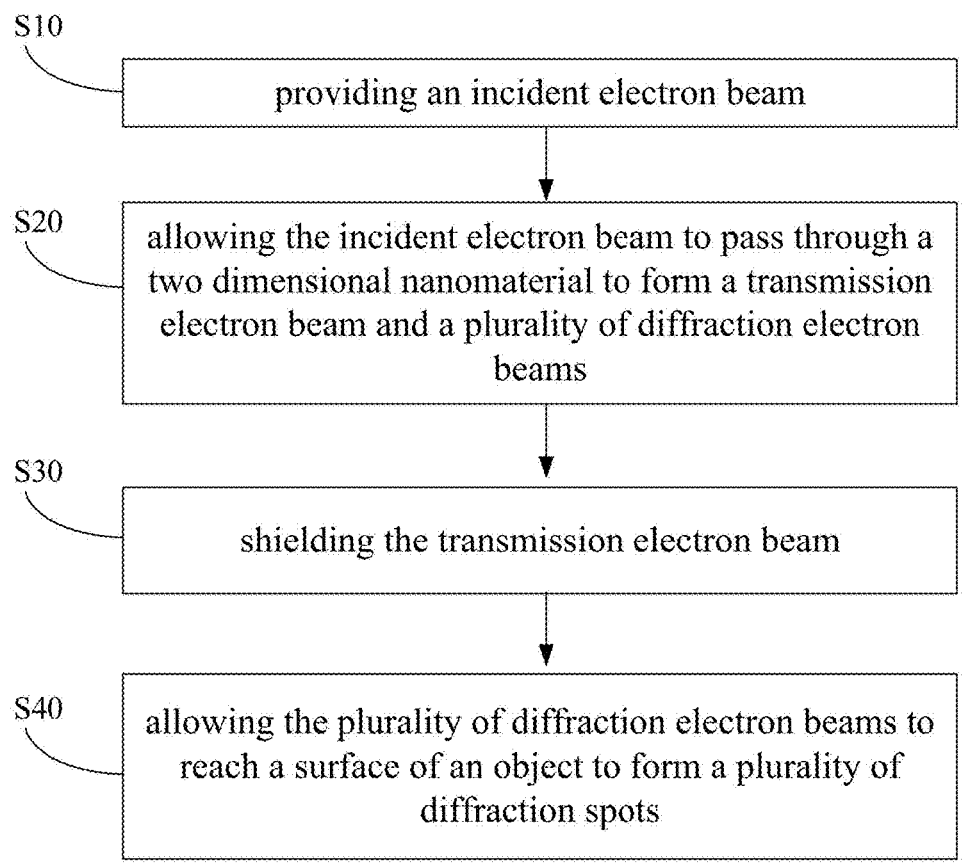
FIG. 10 shows a flowchart of one embodiment of a photolithography method.

Referring to FIG. 10 a photolithography method of one embodiment includes following steps:

S10, providing an incident electron beam 22;

S20, allowing the incident electron beam 22 to pass through a two-dimensional nanomaterial 184 to form a transmission electron beam 26 and a plurality of diffraction electron beams 24;

S30, shielding the transmission electron beam 26; and

S40, allowing the plurality of diffraction electron beams 24 to reach a surface of the object 20 to form a plurality of diffraction spots 27.

In step S10, the incident electron beam 22 can be parallel or focused.

In step S20, the incident electron beam 22 can perpendicularly radiate the two-dimensional nanomaterial 184. The two-dimensional nanomaterial 184 can be graphene sheet or $MoS_2$ sheet. The layer number of the two-dimensional nanomaterial 184 can be selected according to need and the transmission and diffraction images as shown in FIGS. 6-9.

In step S30, the transmission electron beam 26 is shielded by the conductor shield 19 electrically connected to the two-dimensional nanomaterial 184. The transmission electron beam 26 and the diffraction electron beam 24 have a different energy. All the diffraction electron beams 24 have the same energy. In another embodiment, some of the plurality of diffraction electron beams 24 are also shielded. Thus, only the rest of the plurality of diffraction electron beams 24 can reach the surface of the object 20 to form a plurality of diffraction spots 27 in step S40. In another embodiment, step S30 can be omitted. Thus, both the transmission electron beam 26 and the plurality of diffraction electron beams 24 reach the surface of the object 20 to form a transmission spot 29 and a plurality of diffraction spots 27 in step S40.

In step S40, the diffraction electron beams 24 can scan the surface of the object 20 by moving the electron gun or moving the holder 16. The size of the diffraction spots 27 and the radius R of diffraction ring can be adjusted by changing the distance D between the two-dimensional nanomaterial 184 and the object 20.

Figure 11:
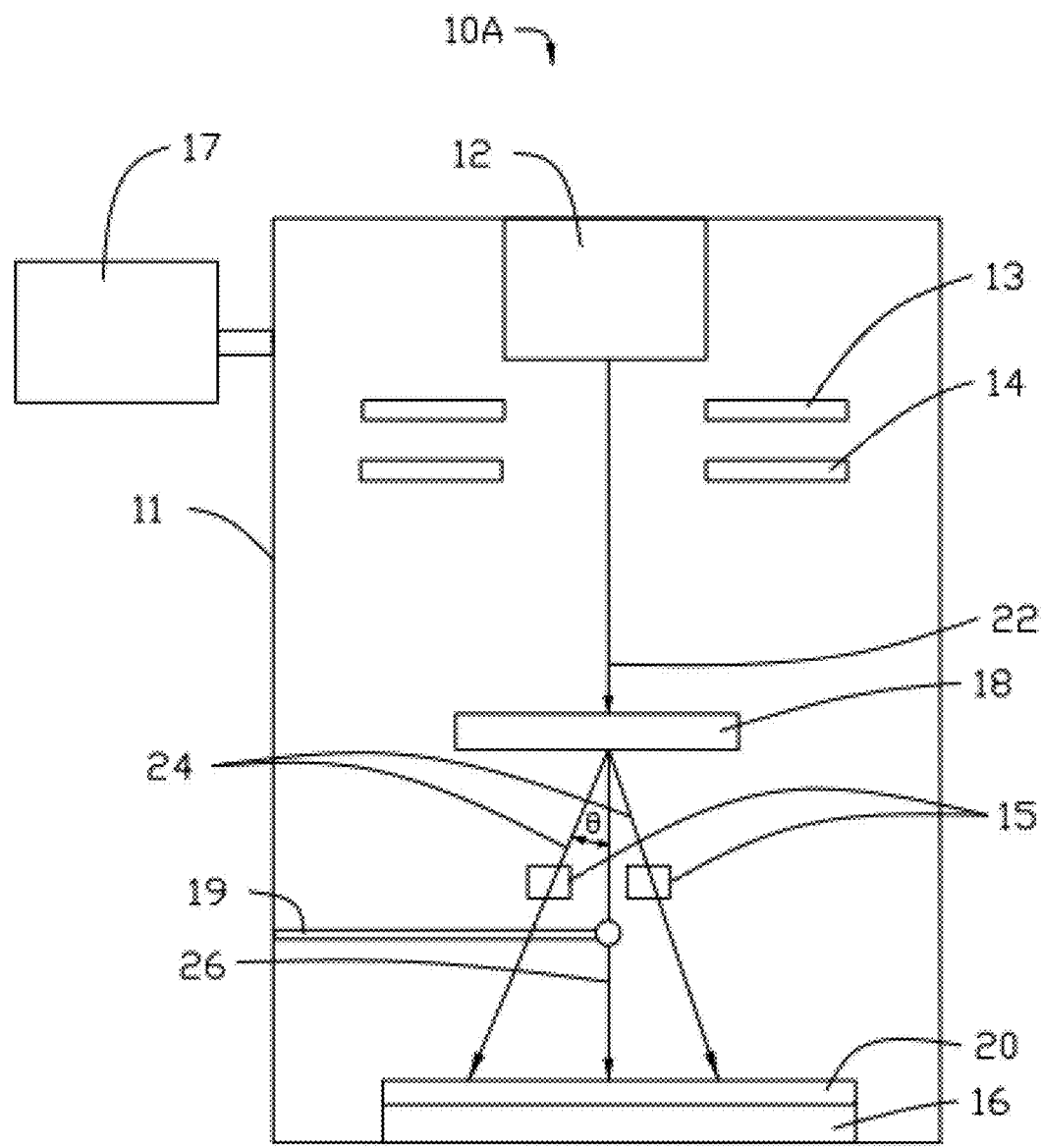
FIG. 11 is a schematic section view of another embodiment of an electronic beam machining system.

Referring to FIG. 11, an electronic beam machining system 10A of another embodiment is an electron beam welding system, an electron beam drilling system, an electron beam melting system, or an electron beam heating system. The electronic beam machining system 10A comprises a vacuum chamber 11, an electron emitter 12, a controlling gate 13, an accelerating electrode 14, a focus electrode 15, a holder 16, a control computer 17, and a diffraction unit 18.

The electronic beam machining system 10 can use a plurality of diffraction electron beams 24 to etch the object 20 and has high efficiency.

The electronic beam machining system 10A is similar to the electronic beam machining system 10 above except that the electronic beam machining system 10A includes a plurality of focus electrodes 15 located between the diffraction unit 18 and the holder 16. Each of the plurality of focus electrodes 15 is located corresponding to one of the plurality of diffraction electron beams 24. The plurality of diffraction electron beams 24 would have lower energy than the incident electron beam 22. The plurality of focus electrodes 15 can further enhance the energy of the plurality of diffraction electron beams 24 to meet the requirement of the electron beam welding system, the electron beam drilling system, the electron beam melting system, or the electron beam heating system. The plurality of focus electrodes 15 is moveable so that the plurality of focus electrodes 15 can be aligned with the plurality of diffraction electron beams 24.

The electronic beam machining system 10A can use a plurality of diffraction electron beams 24 to treat the object 20 and has high efficiency. In one embodiment, six hexagonally arranged holes are drilled on the object 20 simultaneously.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. An electronic beam machining system, comprising:
   a vacuum chamber;
   an electron gun located in the vacuum chamber and configured to emit an incident electron beam;
   a holder located in the vacuum chamber, spaced from the electron gun, and configured to secure an object;
   a diffraction unit located between the electron gun and the holder, wherein the diffraction unit comprises a two-dimensional nanomaterial comprising a single layer of atoms, the incident electron beam is configured to transmit the two-dimensional nanomaterial to form a transmission electron beam and a plurality of diffraction electron beams, and the transmission electron beam and the plurality of diffraction electron beams radiate the object to form a transmission spot and a plurality of diffraction spots; and
   a control computer configured to control the electronic beam machining system.

2. The electronic beam machining system of claim 1, wherein the two-dimensional nanomaterial is a graphene sheet.

3. The electronic beam machining system of claim 1, wherein the two-dimensional nanomaterial is a $MoS_2$ sheet.

4. The electronic beam machining system of claim 1, wherein the diffraction unit further comprises a grid, and the two-dimensional nanomaterial and the grid are stacked with each other.

5. The electronic beam machining system of claim 4, wherein the grid is a copper mesh.

6. The electronic beam machining system of claim 4, wherein the grid is a carbon nanotube structure.

7. The electronic beam machining system of claim 6, wherein the carbon nanotube structure comprises two drawn carbon nanotube films stacked with each other.

8. The electronic beam machining system of claim 7, wherein aligned directions of carbon nanotubes between the two drawn carbon nanotube films is about 90 degrees.

9. The electronic beam machining system of claim 4, wherein the diffraction unit further comprises a metal sheet having a central through hole, and the grid is located on the metal sheet and covers the central through hole.

10. The electronic beam machining system of claim 1, further comprising a conductor shield configured to shield at lease one of the transmission spot and the plurality of diffraction spots.

11. The electronic beam machining system of claim 10, wherein the conductor shield comprises a first conductive rod having a first end fixed on an inner wall of the vacuum chamber and a second end opposite to the first end, and a first conductive plate fixed on the second end.

12. The electronic beam machining system of claim 11, wherein the conductor shield further comprises a plurality of second conductive rods connected to the first conductive plate and a plurality of second conductive plates respectively connected to the plurality of second conductive rods.

13. The electronic beam machining system of claim 12, wherein the plurality of second conductive rods are rotatable around the first conductive plate.

14. The electronic beam machining system of claim 10, wherein the conductor shield is connected to an external circuit.

15. The electronic beam machining system of claim 14, wherein both the conductor shield and the two-dimensional nanomaterial are connected to the external circuit.

16. The electronic beam machining system of claim 1, wherein the diffraction unit is connected to a power supply adapted to accelerate the incident electron beam.

17. The electronic beam machining system of claim 1, further comprising a plurality of focus electrodes located between the diffraction unit and the holder, and each of the plurality of focus electrodes is located corresponding to one of the plurality of diffraction electron beams.

18. The electronic beam machining system of claim 1, wherein the control computer is configured to control the electronic beam machining system according to a first formula $d \sin \theta \cong d\theta = \lambda$ and a second formula $\sin \theta = R/(D^2+R^2)^{1/2}$, where d represents a lattice period of the two-dimensional nanomaterial, $\lambda$ represents a wavelength of the incident electron beam, $\theta$ represents an angle between the transmission electron beam and the plurality of diffraction electron beams, D represents a distance between the two-dimensional nanomaterial and the object, and R represents a radius of a diffraction ring formed by the plurality of diffraction spots.

* * * * *